(12) United States Patent
Basu et al.

(10) Patent No.: US 10,930,738 B2
(45) Date of Patent: Feb. 23, 2021

(54) SUB-FIN LEAKAGE CONTROL IN SEMICONDCUTOR DEVICES

(71) Applicant: INTEL CORPORATION, Santa Clara, CA (US)

(72) Inventors: Dipanjan Basu, Hillsboro, OR (US); Seung Hoon Sung, Portland, OR (US); Glenn A. Glass, Portland, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/611,125

(22) PCT Filed: Jun. 29, 2017

(86) PCT No.: PCT/US2017/039932
§ 371 (c)(1),
(2) Date: Nov. 5, 2019

(87) PCT Pub. No.: WO2019/005059
PCT Pub. Date: Jan. 3, 2019

(65) Prior Publication Data
US 2020/0075727 A1    Mar. 5, 2020

(51) Int. Cl.
*H01L 29/08*    (2006.01)
*H01L 29/165*   (2006.01)
(Continued)

(52) U.S. Cl.
CPC ........ *H01L 29/0847* (2013.01); *H01L 29/165* (2013.01); *H01L 29/205* (2013.01); *H01L 29/66795* (2013.01); *H01L 29/785* (2013.01)

(58) Field of Classification Search
CPC . H01L 45/0847; H01L 45/165; H01L 45/205; H01L 45/66795; H01L 45/785
(Continued)

(56) References Cited

U.S. PATENT DOCUMENTS

2014/0239399 A1* 8/2014 Nagumo ........... H01L 29/66795
257/347
2016/0043190 A1   2/2016 Banghart et al.
(Continued)

FOREIGN PATENT DOCUMENTS

KR   10-2011-0085002 A   7/2011
KR      10-1401274 B1    5/2014
(Continued)

OTHER PUBLICATIONS

International Preliminary Report on Patentability received for PCT/US2017/039932 dated Jan. 9, 2020. 7 pages.
(Continued)

*Primary Examiner* — Igwe U Anya
(74) *Attorney, Agent, or Firm* — Schwabe, Williamson & Wyatt, P.C.

(57) ABSTRACT

A replacement fin in a heterogeneous FinFET transistor in which source and drain regions are grown in corresponding trenches that extend into a sub-fin region. This depth of the epitaxial source/drain regions, in combination with the selected materials, can reduce off-state leakage while also keeping high defect density portions out of the active portions of the source and drain. In one embodiment, materials are selected for the source and drain regions that have an energy band offset from the material selected for the substrate. This band offset between the source/drain material can further reduce sub-fin leakage.

20 Claims, 9 Drawing Sheets

(51) Int. Cl.
*H01L 29/205* (2006.01)
*H01L 29/66* (2006.01)
*H01L 29/78* (2006.01)

(58) Field of Classification Search
USPC .......................................................... 257/190
See application file for complete search history.

(56) References Cited

U.S. PATENT DOCUMENTS

2016/0099343 A1* 4/2016 Pawlak ............... H01L 29/0834
257/12
2016/0247910 A1* 8/2016 Suzuki ................ H01L 29/0623
2018/0151732 A1* 5/2018 Mehandru ......... H01L 29/66795

FOREIGN PATENT DOCUMENTS

| KR | 10-2015-0031900 A | 3/2015 |
| WO | 2016099895 A1 | 6/2016 |
| WO | 2019005059 A1 | 1/2019 |

OTHER PUBLICATIONS

PCT Search Report and Written Opinion for PCT/US2017/039932 dated Feb. 22, 2018, 10 pages.

* cited by examiner

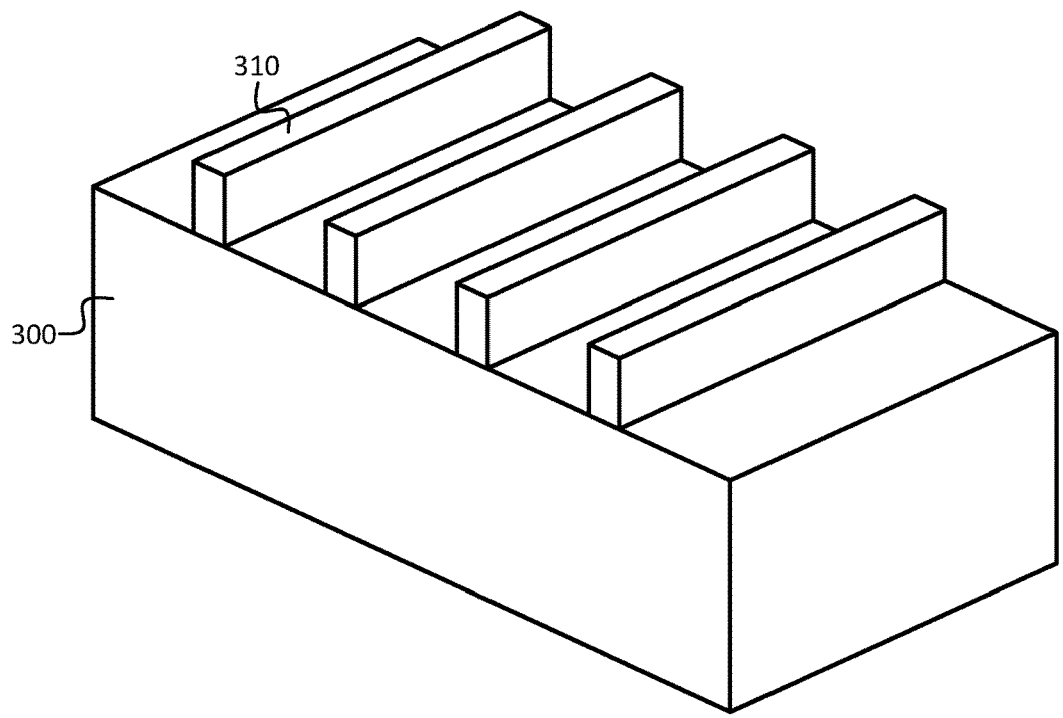
FIG. 3A
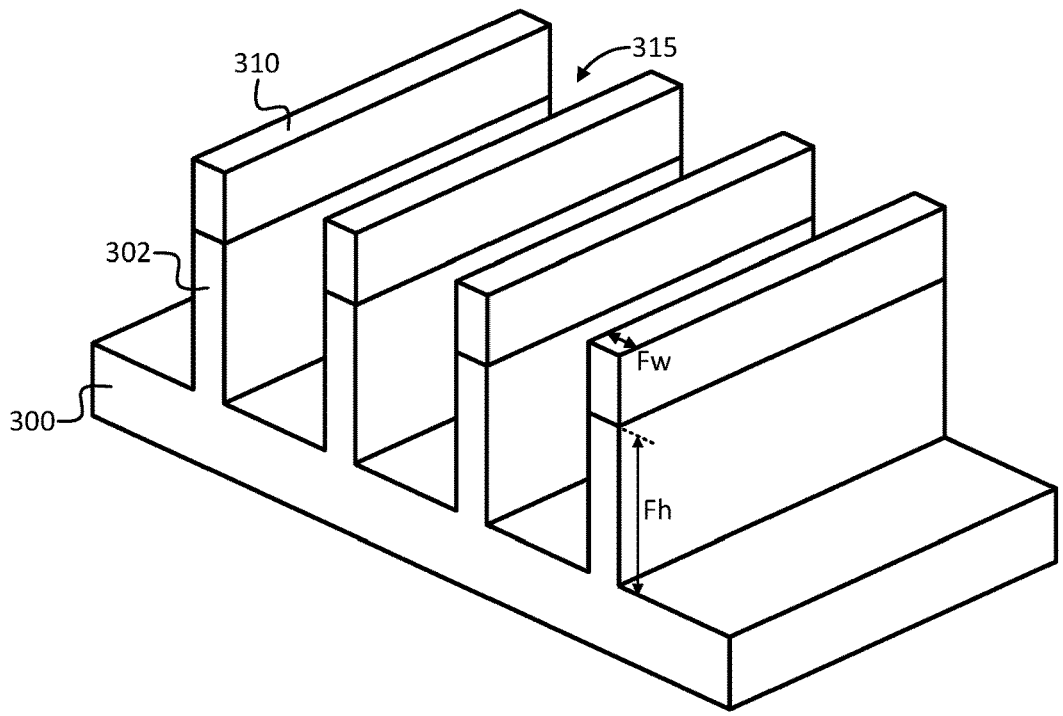
FIG. 3B
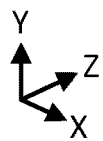

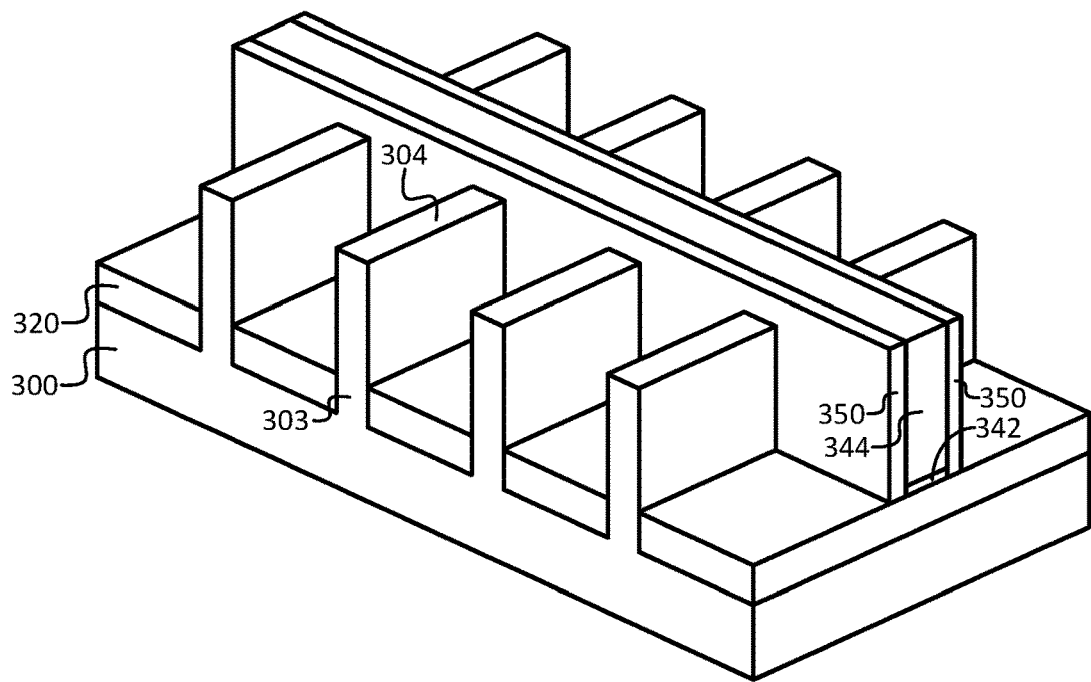
FIG. 3E
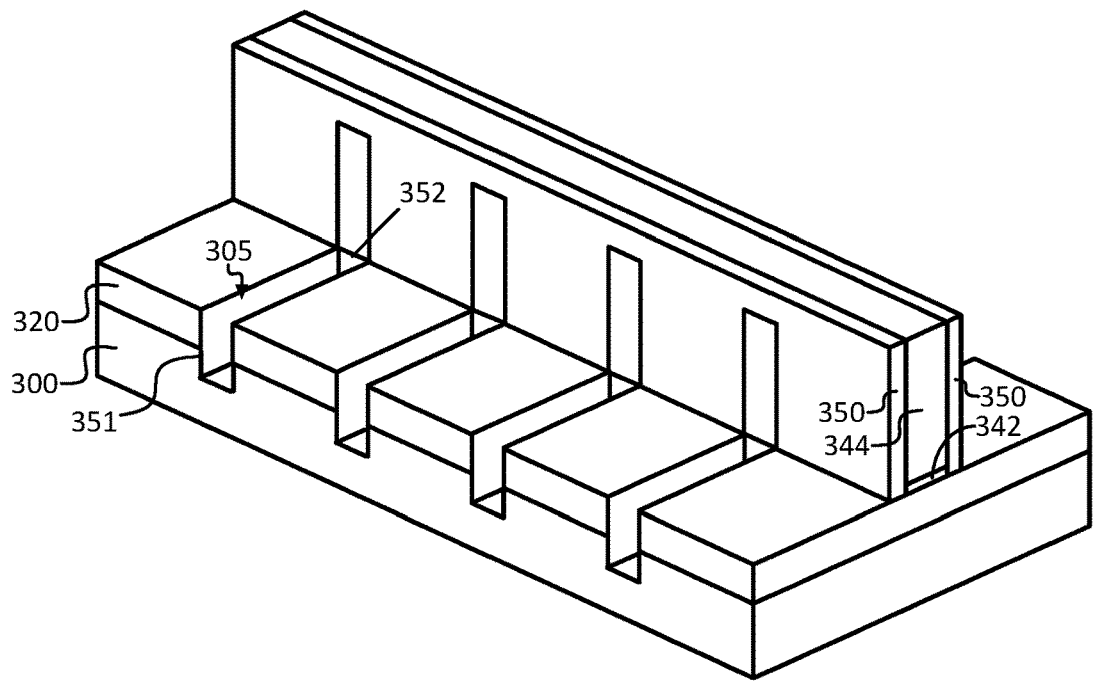
FIG. 3F
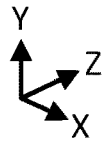

SUB-FIN LEAKAGE CONTROL IN SEMICONDCUTOR DEVICES

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopant used for Si, Ge, and SiGe includes boron (B) for p-type (acceptor) dopant and phosphorous (P) or arsenic (As) for n-type (donor) dopant. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

BRIEF DESCRIPTION OF THE DRAWINGS

FIGS. 3A-3H are schematic perspective views of a FinFET semiconductor device at various stages of the example method flow diagram of FIG. 2, in accordance with an embodiment of the present disclosure.

Figure 1A:
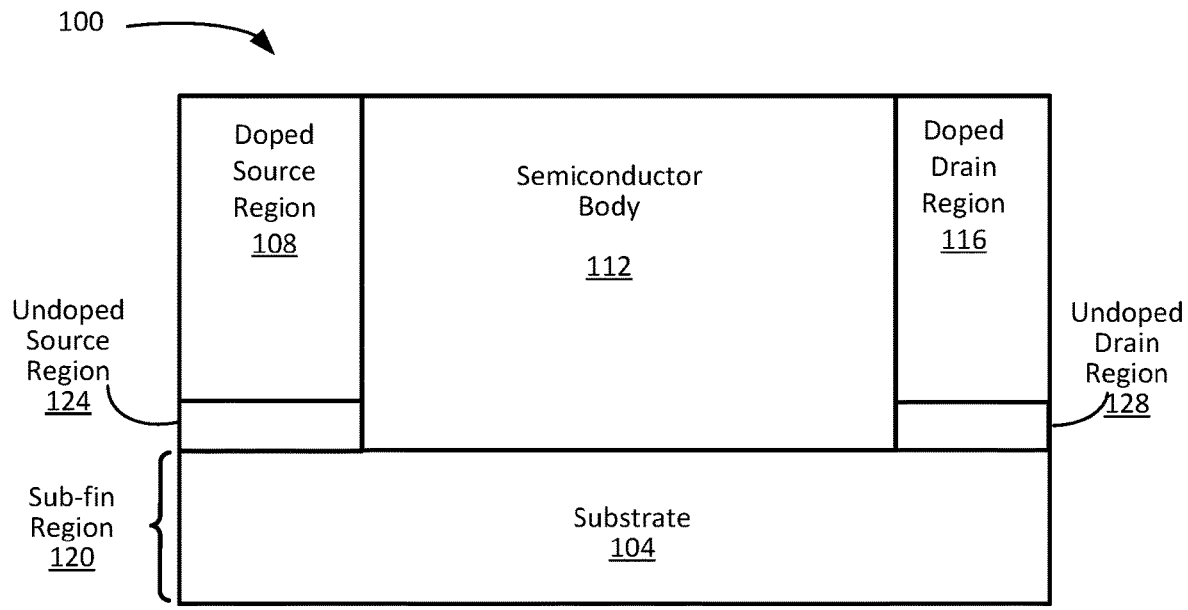
FIG. 1A is a cross-sectional view of an example FinFET semiconductor device that includes both doped and undoped portions of source and drain regions of the fin, the cross-section taken perpendicular to a gate.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Embodiments described herein include a replacement fin in a heterogeneous FinFET transistor. A replacement fin is a fin not native to the underlying substrate, and generally provides the channel portion of the transistor device. Source and drain regions are grown in corresponding trenches that extend into a sub-fin region of the substrate. The channel region is between the source/drain regions, and is covered on three or more sides by a gate structure, to provide FinFET (e.g., double-gate and tri-gate devices) and nanowire configurations. In any such cases, fabricating source and drain regions so that corresponding bottom surfaces of the source and the drain regions extend below the gate structure and are in the sub-fin region can reduce off-state leakage while also keeping high defect density portions of the fin out of the active portions of the source and drain, as will be appreciated in light of this disclosure. In one embodiment, semiconductor material is deposited in the source and drain regions, and an intervening semiconductor body (corresponding to a channel region) is provisioned between the source/drain material. Each of the source/drain material and the semiconductor body has an energy band offset for the majority charge carrier from the material selected for the substrate. This band offset between the source/drain material and the substrate can further reduce sub-fin off-state leakage. In some examples, the same band offset of the source/drain material and the substrate is present between a semiconductor body (channel region between the source region and drain region) and the substrate. While this can also contribute to reducing off-state leakage, generally its effect is less dramatic than that at the source/drain—substrate interface because of charge carrier depletion in the semiconductor body in the off-state. Thus, various embodiments that include replacement material (not native to the underlying substrate) in the source, drain, and channel regions can have improved transistor on-state drive current without increasing off-state leakage. This improves an "on/off" current ratio for transistors. To this end, reference to replacement fin herein may refer to a semiconductor fin or body in the channel region, or a semiconductor fin or body or epitaxial deposition in the source region, or a semiconductor fin or body or epitaxial deposition in the drain region. Note that the replacement material in the source/drain regions may be different from the replacement material in the channel region. In other embodiments, the replacement material in the source/drain regions is the same as the replacement material in the channel region. Numerous variation and configurations will be apparent.

General Overview

One factor in the design of transistors, whether a planar architecture or a non-planar architecture, is the minimization of leakage current. Leakage current is current flow from source to drain through the channel and/or the substrate below the gate of a transistor when the transistor is electrically biased "off" so as to prevent current flow. For FinFET and nanowire architectures, leakage current can flow through a "sub-fin" region of the substrate disposed under a semiconductor body that includes the channel region. This sub-fin leakage degrades performance of the transistor.

The sub-fin region of the substrate (i.e., a portion of the substrate below a bottom surface of the gate covered semiconductor body) can be doped with a dopant that creates oppositely charged carriers compared to the dopant used in the source and the drain regions. This can reduce the leakage through the sub-fin portion of the substrate when the transistor is in an off-state (e.g., biased so as to prevent current flow) because charge carriers of one charge type do not diffuse in significant quantities into regions that have an oppositely charged carrier. In an illustration, a sub-fin region of a substrate can be lightly doped with an n-type dopant or undoped, and source/drain portions of a fin (whether native to the fin or epitaxially deposited on the fin) can be heavily doped using a p-type dopant. Even though the gate in a FinFET architecture has no direct control over the portion of the substrate disposed below the gate (or more specifically, below the gate covered semiconductor body that includes the channel region), diffusion of holes from the source to the drain in the off-state of the FinFET is prevented by the opposite doping (i.e., n-type doping) of the sub-fin portion in some such cases where the channel portion is lightly doped. The opposite doping creates an energetic barrier due to misalignment of band energies of the p-type source/drain compared to the n-type sub-fin region. However, for FinFETs with small channel lengths (e.g., a distance between a source region and a drain region that is less than 20 nm or less than 10 nm), doping the sub-fin region is insufficient to control off-state leakage in the sub-fin region. This can be for a number of reasons, some of which include a reduction in energetic barrier between oppositely doped regions caused by classical short channel effects where a channel length is on a same dimensional order as a size of a depletion layer in a doped source or drain. Other short channel effects include the hot electron effect, charge sharing, and drain induced barrier lowering ("DIBL"), among others.

Furthermore, to preserve good control over the flow of charge carriers through a semiconductor device, a dopant generally should not extend from the source or drain region into the sub-fin region. This is because the gate has little control over the flow of charge carriers in the sub-fin region. Thus, in some cases, even small amounts of doping in the sub-fin region can lead to off-state leakage that can be detrimental to device performance. To avoid this dopant-induced sub-fin leakage, often a portion of each of the source region and the drain region are not doped. This configuration is shown in FIG. 1A, which is a cross-sectional view of an example semiconductor device 100 taken perpendicular to a gate. As shown, the device 100 includes a substrate 104, a doped source region 108, a doped drain region 116, and a semiconductor body 112 that includes the channel region (e.g., on one or more of the side and top surfaces of the semiconductor body 112). The semiconductor device 100 also includes an undoped source region 124 and an undoped drain region 128. It will be appreciated that the source electrode, the drain electrode, and the gate electrode, as well as associated spacers, liners, and diffusion barriers are omitted from FIG. 1A for clarity of explanation. As shown, the undoped source region 124 is disposed between the doped source region 108 and the sub-fin region 120 of the substrate 104. Similarly, the undoped drain region 128 is disposed between the doped drain region 116 and the sub-fin region 120 of the substrate 104. By tailoring processing to include the undoped source region 124 and the undoped drain region 128 within a fin, unintentional doping of the sub-fin region is avoided. This reduces the potential for off-state leakage. However, the configuration shown in FIG. 1A can also reduce performance of the device 100 because undoped regions 124, 128 will generally have a lower electrical conductivity than the corresponding doped source/drain regions 108, 116.

Heterogeneous FinFET transistors can reduce some of this off-state, sub-fin leakage. Heterogeneous FinFETs can include a first material selected for a source and drain region and a second material selected for the substrate where the first and second materials are compositionally different from one another. In some examples, the first material of the source/drain regions (and optionally the semiconductor body) is selected so that there is an energetic barrier between the electronic bands of the majority carrier of the source/drain regions (and optionally the semiconductor body) and the majority carrier of the substrate material in the sub-fin region. This "band offset" reduces sub-fin leakage. In one example case for group IV semiconductor material devices, when germanium-rich material is used for source and drain regions on a silicon substrate, there is a band energy offset of 0.4 eV (+/−0.05 eV) in the valence band between the two materials. For a group III-V semiconductor material devices, such as those including indium gallium arsenide (InGaAs) source/drain regions on a gallium arsenide (GaAs) substrate, there is a 0.7 eV (+/−0.05 eV) band offset in the conduction band. These band offsets reduce the off-state leakage current. In another example, germanium (Ge) fins or bodies can be fabricated on a silicon (Si) substrate (e.g., using an aspect ratio trapping process where sacrificial silicon fins are recessed and replaced with germanium fins). This material combination can have low off-state leakage because of (1) a 0.4 eV valence band offset between the Ge and Si and (2) the oppositely charged charge carriers between the two materials (electrons for Si and holes for Ge). With extrinsic doping of the Ge source and drain portions, the band gap offset can be increased to as much as 0.8 eV, thus further reducing off-state leakage. However, as transistor architectures and the associated channel dimensions continue to shrink, the Ge and Si configuration described above can still have off-state leakage, caused by any one or more of several mechanisms. In some cases, the mechanism by which the leakage occurs can be a function of the fin fabrication. For example, growth of a replacement fin can either start on an undoped seed layer used to epitaxially grow a replacement fin or start directly from an epitaxially mismatched substrate. While epitaxial growth from an undoped seed layer enables a low defect density fin to be formed (thus reducing leakage), including this undoped portion within the fin reduces transistor performance, for the same reasons described above in the context of FIG. 1A.

Figure 1B:
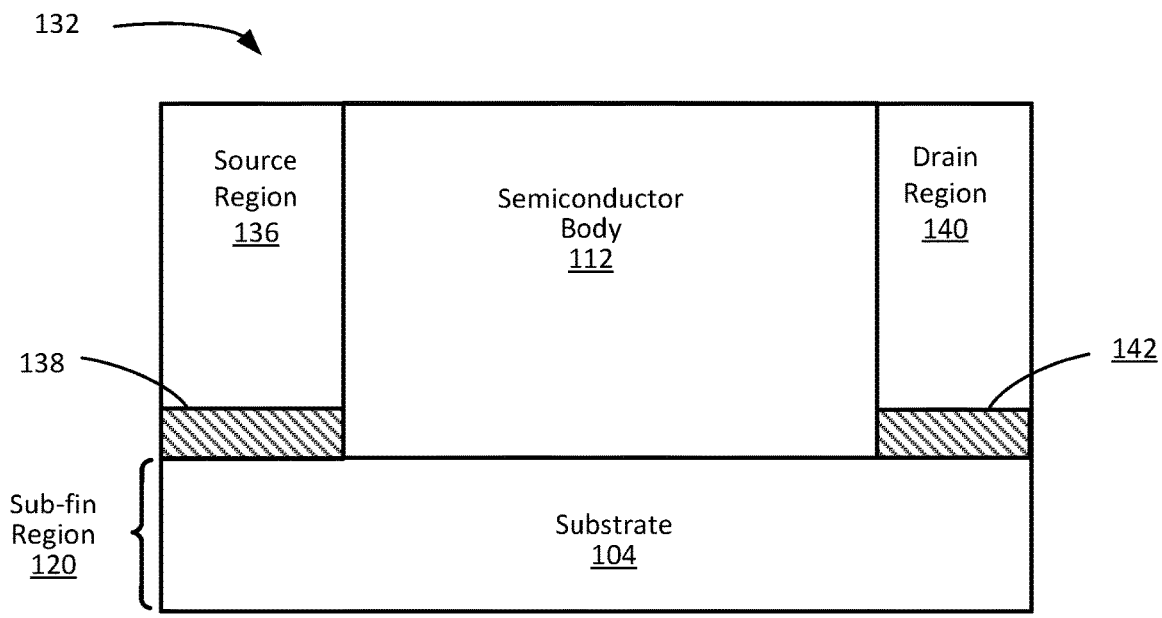
FIG. 1B is a cross-sectional view of an example FinFET semiconductor device that includes defective portions of source and drain regions of the fin, the cross-section taken perpendicular to a gate.

Growing a replacement fin directly on the underlying substrate can lead to a portion of the source and drain portions with defects, thus increasing off-state leakage. This is illustrated in FIG. 1B. FIG. 1B shows a cross-sectional view of an example semiconductor transistor device 132 taken perpendicular to a gate. The semiconductor transistor device 132 includes a substrate 104, a source region 136, a semiconductor body 112 containing the gate, and a drain region 140. As with FIG. 1A, the source electrode, the drain electrode, and the gate electrode, as well as associated spacers, liners, and diffusion barriers are omitted from FIG. 1B for clarity of explanation. As indicated above, the source region 136 and the drain region 140 are grown from a replacement material that is epitaxially mismatched with the substrate 104. Examples of this scenario include germanium source/drain regions grown on a silicon substrate or indium gallium arsenide (InGaAs) source/drain regions grown on a gallium arsenide (GaAs) substrate. As a result of this epitaxial mismatch (e.g., lattice parameters of the substrate and source/drain materials differing more than 4%), portion 138 of the source region 136 and portion 142 of the drain region 140, both of which are proximate to the sub-fin region 120 of the substrate 104, have increased defect densities (e.g., dislocations) compared to materials that are epitaxially matched with the substrate. An increased defect density in these portions 138, 142, can cause an increase off-state leakage and thus degrade performance of the device 132.

In any of the scenarios described above, including the scenarios shown in FIGS. 1A and 1B, the resulting transistor devices can exhibit reduced electrical conductivity and therefore also exhibit an increase in the external resistance. This increased external resistance can reduce the electrical drive current of a device, particularly for high gate bias and high drain bias (high current) conditions.

Thus, in accordance with an embodiment of the present disclosure, the source/drain regions in a heterogeneous FinFET transistor configuration are epitaxially grown in trenches that extend into a sub-fin region, past the bottom of the intervening gate structure. Fabricating source and drain regions so that a corresponding bottom surface of these source and drain regions extends within a sub-fin region below the bottom of the intervening gate structure can reduce off-state leakage while keeping high defect portions of the source/drain regions out of the active portions of the source and drain regions, as will be appreciated. In one embodiment, semiconductor materials are selected for the source and drain regions (and optionally intervening semiconductor body) that have an energy band offset from the material selected for the substrate. This band offset between the source/drain material and the substrate material, particularly for the sub-fin region of the substrate, can further reduce sub-fin leakage.

Figure 1C:
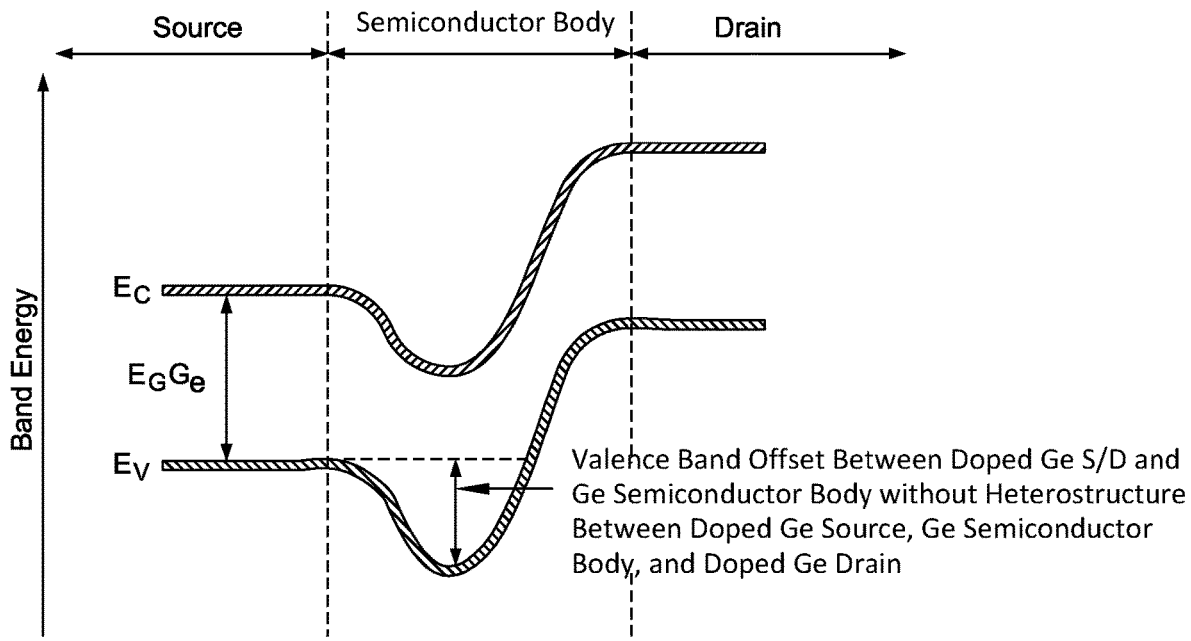
FIG. 1C illustrates band energies of portions of a FinFET as a function of cross-sectional location (perpendicular to a gate) of the FinFET.
Figure 1D:
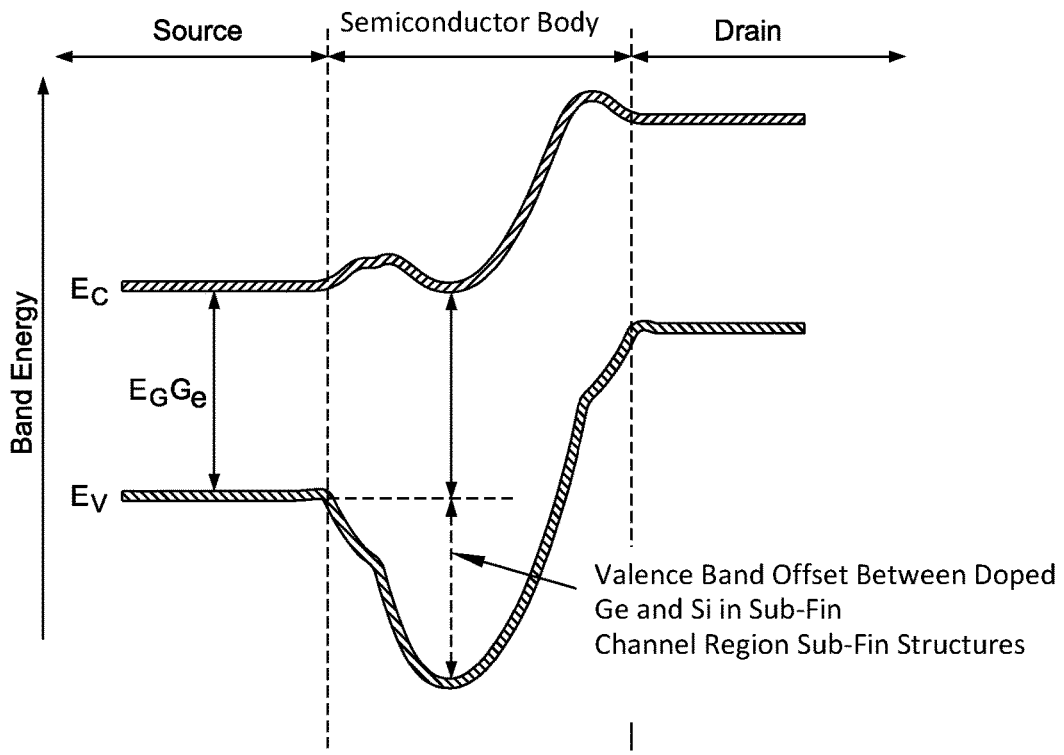
FIG. 1D illustrates band energies of portions of a FinFET as a function of cross-sectional location (perpendicular to a gate) of the FinFET along line 1D in FIG. 4, the FinFET including a sub-fin region in source and drain regions of the FinFET, in accordance with an embodiment of the present disclosure.

This benefit is shown by comparing band energies schematically illustrated in FIGS. 1C and 1D. FIG. 1C shows conduction band ($E_C$) and valence band ($E_V$) energies for a germanium (Ge) fin on a silicon (Si) substrate as a function of cross-sectional location. The structure corresponding to FIG. 1C does not include source and drain portions that extend into a sub-fin region. These band energy diagrams, taken perpendicular to the gate, identify the band energies for portions of device (i.e., source a channel region, and drain). As shown, these energies are relatively close to one another (approximately 0.4 eV), which can lead to a likelihood of sub-fin leakage. However, FIG. 1D illustrates the band offset between the $E_V$ energies for Si and Ge in the sub-fin region below the source region, drain region, and semiconductor body for a semiconductor device prepared according to some embodiments described herein. This graph corresponds to locations along line FIG. 1D indicated in FIG. 4. As shown, the band offset between the $E_V$ energies for Si and Ge in the sub-fin region when disposing a portion of the source and drain regions in the sub-fin region of the substrate increases dramatically (by as much as an additional 0.4 eV) relative to the energies shown in FIG. 1C. This increase in band offset can reduce the sub-fin leakage.

Configuring a FinFET or nanowire transistor so that source and drain portions extend into a sub-fin region has a number of advantages. For example, source and drain fin portions can be epitaxially nucleated in trenches defined by the substrate in the sub-fin region, thus disposing a bottom portion of the fin within the sub-fin region. This places an undoped seed layer (used to facilitate epitaxial growth) below an active portion of the fin or places a portion of the non-epitaxially grown fin (with increased defect density) below an active portion of the replacement fin. In both of the situations, a portion of the replacement fin that would otherwise degrade device performance (because of either undoped electrical properties or crystallographic defects) is placed in the sub-fin region. By confining regions of a fin more likely to be defective or have less desirable electrical properties to a sub-fin region is less likely to impact an electrical performance of the device as a whole.

It is noted that designations such ""above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

Fabrication Techniques

Figure 2:
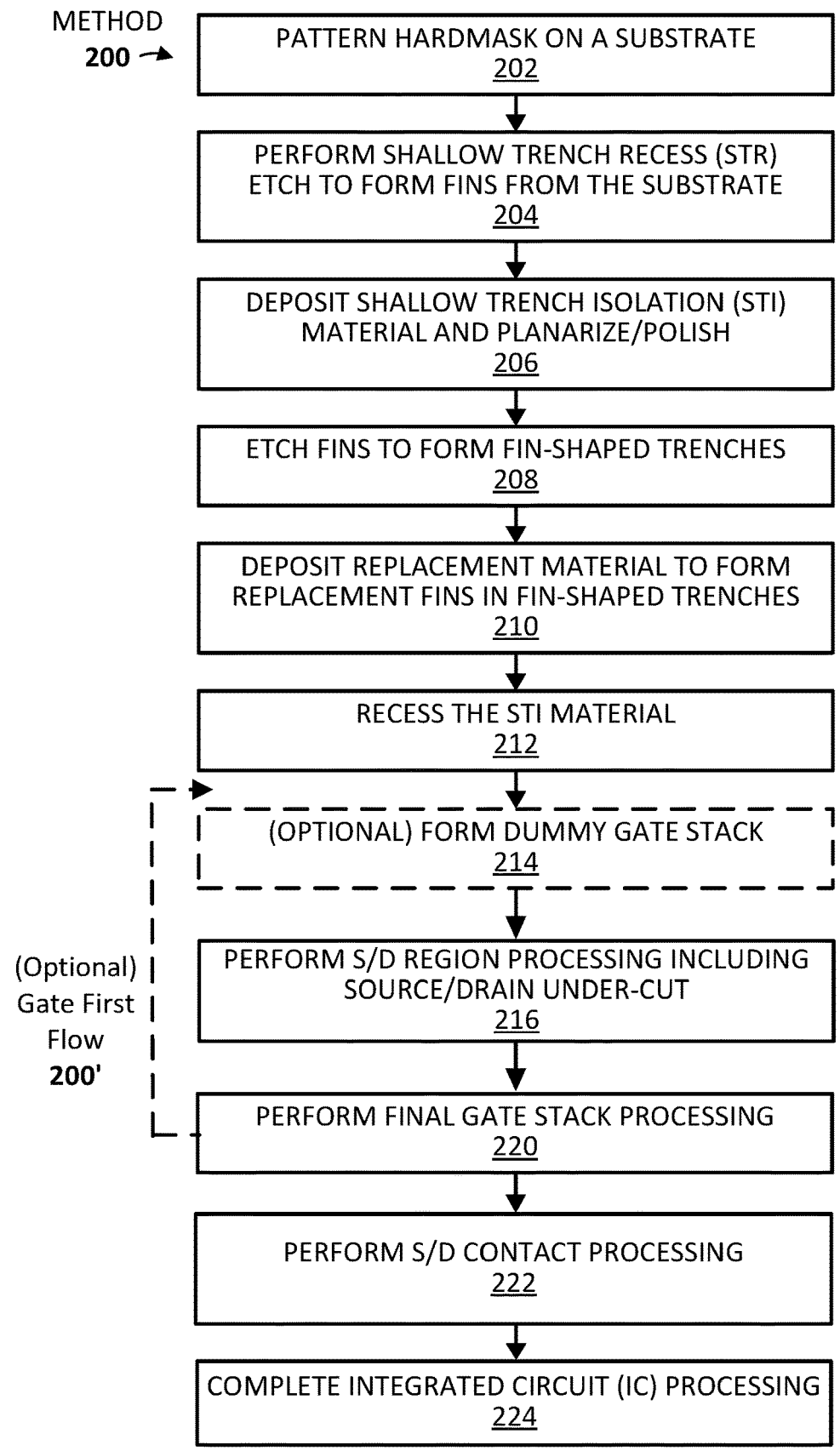
FIG. 2 is a method flow diagram depicting an example method for fabricating a FinFET semiconductor device that includes source and drain regions in a sub-fin region of the substrate for reducing off-state leakage, in accordance with an embodiment of the present disclosure.

Method 200 of FIG. 2 includes patterning 202 hardmask on a substrate, such as patterning hardmask 310 on substrate 300 to form the example structure of FIG. 3A, in accordance with some embodiments. In some embodiments, hardmask 310 may be deposited or otherwise formed on substrate 300 using any suitable techniques as will be apparent in light of this disclosure. For example, hardmask 310 may be blanket deposited or otherwise grown on substrate 300 using chemical vapor deposition (CVD), atomic layer deposition (ALD), physical vapor deposition (PVD), spin-on processing, and/or any other suitable process to form hardmask 310 on substrate 300. In some instances, the top surface of substrate 300 on which hardmask 310 is to be deposited may be treated (e.g., via chemical treatment, thermal treatment, etc.) prior to deposition of the hardmask 310 material. After being blanket formed on substrate 300, hardmask 310 may then be patterned using any suitable techniques, such as one or more lithography and etch processes, for example. Hardmask 310 may include any suitable material, such as oxide material, nitride material, and/or any other suitable dielectric/electrical insulator material, for example. Specific oxide and nitride materials may include silicon oxide, titanium oxide, hafnium oxide, aluminum oxide, silicon nitride, and titanium nitride, just to name a few examples. In some cases, the material of hardmask 310 may be selected based on the material of substrate 300, for example.

In other embodiments the substrate 300 may be: a bulk substrate including group IV semiconductor material (e.g., Si, Ge, SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, substrate 300 may be doped with any suitable n-type and/or p-type dopant selected in light of the dopant used to dope replacement fins (as described herein). For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 300 may be undoped/intrinsic or relatively minimally doped (such as including a dopant concentration of less than 1E16 atoms per cubic cm), as long as a band offset in a sub-fin region is maintained with the source and drain regions, as described herein. In some embodiments, substrate 300 may include a surface crystalline orientation described by a Miller index of (100), (110), or (111), or its equivalents, as will be apparent in light of this disclosure. Although substrate 300, in this example embodiment, is shown as having a thickness (dimension in the Y-axis direction) similar to other layers shown in subsequent structures for ease of illustration, in some instances, substrate 300 may be much thicker than the other layers, such as having a thickness in the range of 50 to 950 microns, for example, or any other suitable thickness as will be apparent in light of this disclosure.

In some embodiments, substrate 300 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Method 200 of FIG. 2 continues with performing 204 shallow trench recess (STR) etch to form fins 302 from substrate 300, thereby forming the resulting example structure shown in FIG. 3B, in accordance with some embodiments. In some embodiments, the STR etch 204 used to form trenches 315 and fins 302 may include any suitable techniques, such as various masking processes and wet and/or dry etching processes, for example. In some cases, STR etch 204 may be performed in-situ/without air break, while in other cases, STR etch 204 may be performed ex-situ, for example. Trenches 315 may be formed with varying widths (dimension in the X-axis direction) and depths (dimension in the Y-axis direction) as can be understood based on this disclosure. For example, multiple hardmask patterning 202 and STR etching 204 processes may be performed to achieve varying depths in the trenches 315 between fins 302. Fins 302 may be formed to have varying widths Fw (dimension in the X-axis direction) and heights Fh (dimension in the Y-axis direction). Note that although hardmask structures 310 are still present in the example structure of FIG. 3B, in some cases, that need not be the case, as they may have been consumed during the STR etch, for example.

In some embodiments, the fin widths Fw (dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights Fh (dimension in the vertical or Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, or 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. Note that the trenches 315 and fins 302 are each shown as having essentially the same sizes and shapes in this example structure for ease of illustration; however, the present disclosure is not intended to be so limited. For example, in some embodiments, the fins 302 may be formed to have varying heights Fh, varying widths Fw, varying starting points (or varying starting heights), varying shapes, and/or any other suitable variations as will be apparent in light of this disclosure. Moreover, trenches 315 may be formed to have varying depths, varying widths, varying starting points (or varying starting depths), varying shapes, and/or any other suitable variations as will be apparent in light of this disclosure. Further note that although four fins 302 are shown in the example structure of FIG. 3B for ease of illustration, any number of fins may be formed, such as one, two, three, five, ten, hundreds, thousands, millions, billions, and so forth, as can be understood based on this disclosure.

Figure 3C:
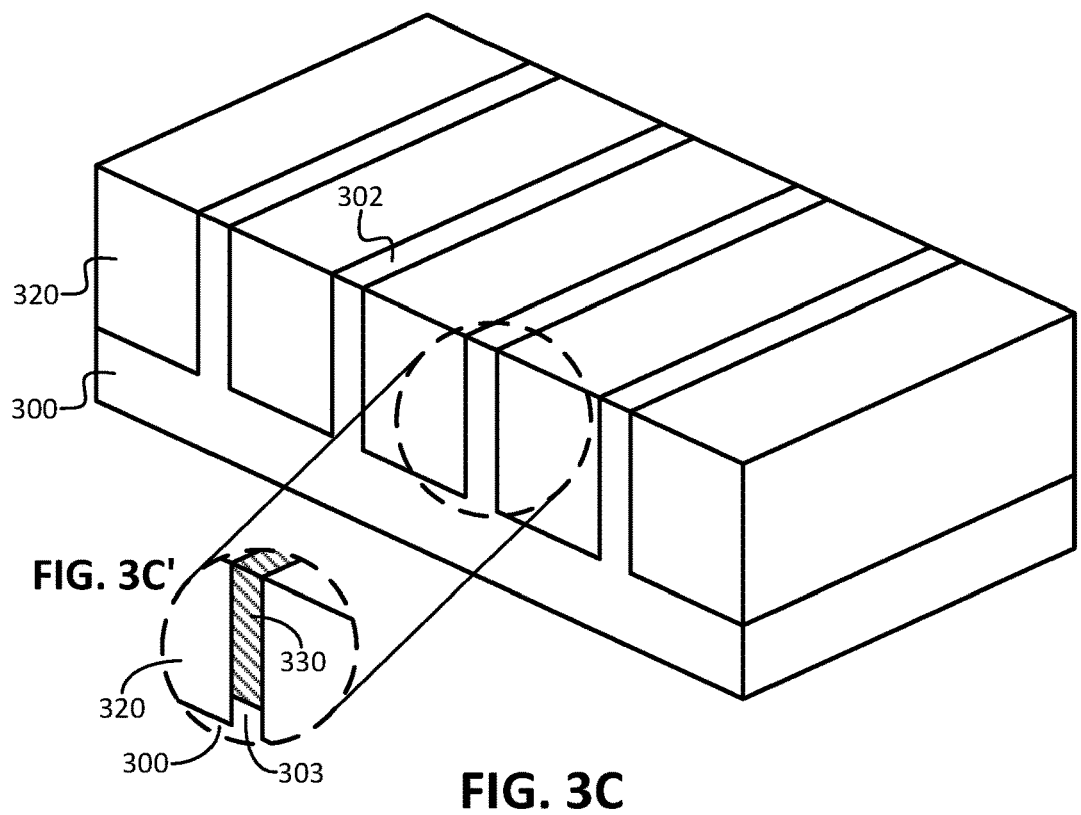

Method 200 of FIG. 1 continues with depositing 206 shallow trench isolation (STI) material 320 and planarizing/polishing the structure to form the example resulting structure of FIG. 3C, in accordance with some embodiments. In some embodiments, deposition 206 of STI material 320 may include any suitable deposition techniques, such as those described herein (e.g., CVD, ALD, PVD), or any other suitable deposition process. In some embodiments, STI material 320 (which may be referred to as an STI layer) may include any suitable electrically insulating material, such as one or more dielectric, oxide (e.g., silicon dioxide), and/or nitride (e.g., silicon nitride) materials. In some embodiments, the material of STI layer 320 may selected based on the material of substrate 300. For instance, in the case of a Si substrate, the STI material may be selected to be silicon dioxide or silicon nitride, to provide some examples. In some embodiments, the planarizing and/or polishing process (es) performed after forming STI material 320 may include any suitable techniques, such as chemical-mechanical planarization/polishing (CMP) processes, for example. In embodiments where the fins are to be removed and replaced with replacement semiconductor material (e.g., to be used in the channel region of one or more transistor devices), the structure of FIG. 3C enables such processing. For example, continuing from the structure of FIG. 3C, fins 302 may be recessed or removed using selective etch processing (e.g., for a given etchant, the semiconductor material of fins 302 is removed selective to the insulator material of STI layer 320) to form fin-shaped trenches between STI material 320 in which replacement semiconductor material can be deposited/grown (e.g., using any suitable techniques, such as CVD, metal-organic CVD (MOCVD), ALD, molecular beam epitaxy (MBE), PVD). For instance, FIG. 3C' is a magnified view of a portion of FIG. 3C illustrating alternative recess and replace processing to form a replacement material fin, in accordance with some embodiments. In FIG. 3C', replacement fin 330 was formed, and the replacement fin 330 (and generally, any replacement fin formed) may include any suitable semiconductor material (e.g., group IV and/or III-V semiconductor material). For instance, replacement fins including SiGe or Ge may be formed by removing native Si fins during such processing and replacing them with the SiGe or Ge material, to provide some examples. In addition, replacement fin 330 may include any suitable n-type or p-type dopant that is selected so that, ultimately, a source region and a drain region have an oppositely charged carrier to that of a substrate, as described herein. In some embodiments, replacement material fins, such as replacement fin 330 of FIG. 3C' may be formed using alternative processing. For instance, in some embodiments, replacement material fins may be formed by blanket-growing the replacement material on the substrate (e.g., using epitaxial deposition processing) and then patterning the replacement material into replacement material fins, to provide an example alternative. Such an example alternative process may also include forming STI material between the replacement material fins to form a structure similar to that shown in FIG. 3C', for instance. Note that replacement fin 330 is illustrated with patterning/shading to merely assist with visually identifying that feature.

Note that only one fin is shown being replaced in the example embodiment of FIG. 3C; however, the present disclosure is not intended to be so limited. In some embodiments, all of the native fins 302 may be replaced 210 or only a subset may be replaced (e.g., such that some replacement fins are available for subsequent processing and some native fins 302 remain for subsequent processing). Further, in some embodiments, the recess and replace process may be performed as many times as desired to form as many subsets of replacement fins as desired by masking off the areas not to be processes for each replacement fin subset processing. In some such embodiments, a first subset of replacement fins may be formed for n-channel transistors (e.g., where the first replacement material is selected to increase electron mobility) and a second subset of replacement fins may be formed for p-channel transistors (e.g., where the second replacement material is selected to increase hole mobility). Further still, in some embodiments, a multilayer replacement fin may be formed to enable the subsequent formation of nanowires or nanoribbons in the channel region of one or more transistors, where some of the layers in the multilayer replacement fin are sacrificial and intended to be removed via selective etching (e.g., during replacement gate processing.

Note that the recess process used to form 210 replacement fin 330 included recessing native fin 302 (i.e., native to substrate 300) to a depth as shown, such that a portion of that native fin 302 remains (indicated in FIG. 3C' as fin portion 303). However, it will be appreciated that, regardless of the depiction in FIG. 3C, ultimately source and drain portions of the fin will be recessed into a sub-fin region (i.e., extending below the semiconductor body that includes the channel region), as described in more detail below. In light of this, some other embodiments include a recess process that may completely remove a given native fin 302 or recess the given native fin 302 to a different depth (e.g., a different point in the vertical or Y-axis direction).

Continuing with the scenario depicted in FIG. 3C', generally, in a trench fill integration scheme, the fins may be formed to have particular height to width ratios (e.g., at least 2-5) such that when they are later removed or recessed, the resulting trenches formed allow the replacement material deposited to grow vertically from the native substrate bottom and be confined by non-crystalline/dielectric sidewalls. The material used to fill these trenches may be sufficiently lattice matched to the substrate (or to a buffer layer used between the substrate and replacement material) such that effectively no relaxation or threading misfit dislocation formation occurs (e.g., the misfit dislocations occur at levels below 1E5 dislocations per square cm). For instance, this lattice match condition is true for native Si fins and trench fill of SiGe replacement material having Ge concentration (by atomic percentage) of less than 45% and fin heights Fh of less than 50 nm, to provide an example. Alternatively, using the Si substrate example (where the native Si fins are recessed to form trenches), a replacement material trench fill of Ge, SiGe with Ge concentration of at least 80%, or GaAs can be performed such that the dislocations form right at the native/replacement material interface and again effectively no threading misfit dislocation formation occurs at the top surface of the replacement material fin (e.g., the misfit dislocations occur at levels below 1E5 dislocations per square cm). In some embodiments, replacement fins (such as replacement fin 330) may be formed to include Ge-rich material, such that a portion of one or more of those replacement fins can be used in the channel region of one or more transistors, as can be understood based on this disclosure. Alternative embodiments can includes forming an epitaxial growth layer on the native substrate from which the replacement fin is regrown.

Figure 3D:
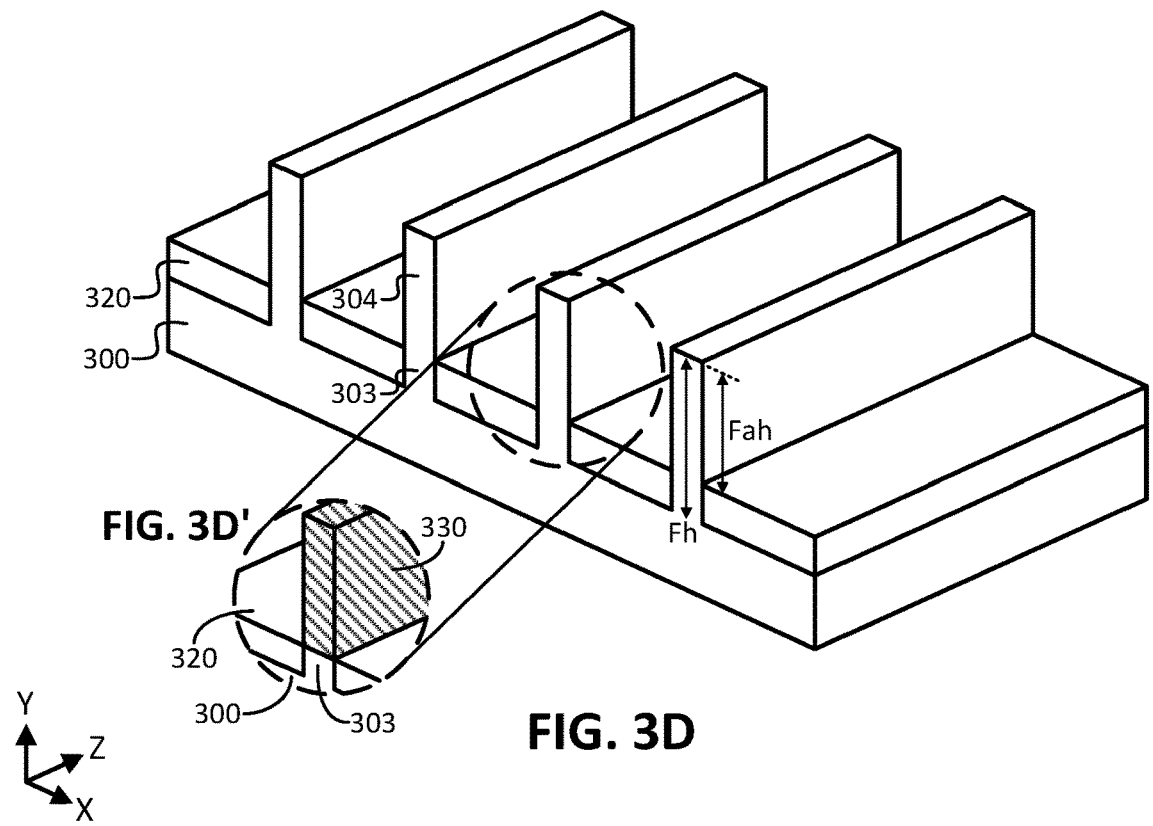

Method 200 of FIG. 2 continues with recessing 212 the STI material 320 to cause at least a portion 304 of fins 302 to protrude from the STI plane, thereby forming the resulting example structure shown in FIG. 3D, in accordance with some embodiments. In some embodiments, recessing 212 may be performed using any suitable techniques, such as using one or more wet and/or dry etch processes that allow the STI material 320 to be selectively recessed relative to the material of fin 302, and/or any other suitable processing as will be apparent in light of this disclosure. As can be understood based on this disclosure, fin portions 304 may be used in the active channel region of one or more transistors, such that fin portions 304 (the portions of fins 302 above the top plane of STI layer 320 after recess 212 has been performed) may be referred to as active fin portions herein, for example. Moreover, region of the substrate below a bottom of the fin 302 (e.g., below a fin height indicated by "Fh" in FIG. 3D) is referred to as a sub-fin region, as discussed herein.

As shown in FIG. 3D, the portions 304 of fins 302 exuding above the top plane of STI layer 320 have an active fin height indicated as Fah, which may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights Fah may be at least 25, 50, 75, 100, 125, 150, 175, 200, 300, 400, 500, 600, 700, or 800 nm tall, or greater than any other suitable threshold height as will be apparent in light of this disclosure. The active fin height is referred to as such because at least one portion of that fin (along the Z-axis) may be used in the channel region of a least one transistor, where the fin portion 303 (which is between two regions of STI material 220) is desired to not be a part of the channel region that includes the location for the active channel. FIG. 3D' is a magnified view of a portion of FIG. 3D illustrating the replacement fin 230 from FIG. 3C' after the STI material has been recessed, in accordance with some embodiments. Although replacement fin 330 was formed using the techniques described herein that employ a fin-shaped trench, in other embodiments, replacement fin 330 may be formed using alternative techniques, such as by blanket depositing the replacement material and forming the replacement material into fins, followed by STI processing, as previously described. Also note that in embodiments employing planar transistor configurations, recess process 208 need not be performed, as the transistor may be formed using the top portion of fin 302 from FIG. 3C (or the top portion of fin 330 from FIG. 3C'), for example.

Method 200 of FIG. 2 continues with optionally forming 214 a dummy gate stack to form the example resulting structure of FIG. 3E, in accordance with some embodiments. Recall that method 200 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 214 (forming a dummy gate stack) would not be performed, and thus, process 214 may be optional in some embodiments (such as those employing the gate first process flow). This is reflected with the alternative location for performing 220 final gate stack processing, which is shown as the optional gate first flow 200' in FIG. 2, where performing 220 the final gate stack processing would instead occur at the location of box 214 in embodiments employing a gate first process flow, for example. However, the description of method 200 will continue using a gate last process flow, to allow for such a flow (which generally includes additional processing) to be adequately described.

Continuing with forming 214 a dummy gate stack, such a dummy gate stack (where employed) may include dummy gate dielectric 342 and dummy gate electrode 344, thereby forming the example resulting structure of FIG. 3E, in this example embodiment. In this example embodiment, dummy gate dielectric 342 (e.g., dummy oxide material) and dummy gate electrode 344 (e.g., dummy poly-silicon material) may be used for a replacement gate process. Note that side-wall spacers 350, referred to generally as gate spacers (or simply, spacers), on either side of the dummy gate stack were also formed, and such spacers 350 can be used to help determine the channel length and/or to help with replacement gate processes, for example. As can be understood based on this disclosure, the dummy gate stack (and spacers 350) can help define the channel region and source/drain (S/D) regions of each fin, where the channel region is below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin, as the gate stack will reside along three walls of the finned channel regions, in embodiments employing a finned (e.g., FinFET) configuration.

Formation of the dummy gate stack may include depositing the dummy gate dielectric material 342 and dummy gate electrode material 344, patterning the dummy gate stack, depositing gate spacer material 350, and performing a spacer etch to form the structure shown in FIG. 3E, for example. Spacers 350 may include any suitable material, such as any suitable electrical insulator, dielectric, oxide (e.g., silicon oxide), and/or nitride (e.g., silicon nitride) material, as will be apparent in light of this disclosure. It will be appreciated that while spacer 350 are shown herein as comprising a single (vertically oriented or horizontally oriented) layer, this need not be the case. In some examples, the spacers 350 can include more than one layer whether to tailor the electrical properties (e.g., dielectric constant) of the spacers 350 or to tailor one or more physical dimensions. Note that in some embodiments, as previously described, the techniques described herein need not include forming a dummy gate stack, such that a final gate stack may be formed in the first instance. Regardless, the end structure will include the final gate stack described herein, as will be apparent in light of this disclosure. Also note that in some embodiments, a hardmask may be formed over the dummy gate stack (which may or may not also be formed over spacers 350) to protect the dummy gate stack during subsequent processing, for example. The previous relevant description of hardmask 310 is equally applicable to such a hardmask feature, where employed.

Method 200 of FIG. 2 continues with performing the source/drain (S/D) region processing 216. The processing 216 includes, in this example embodiment, removing portions of fins 304 (or replacement fins 330, where employed) located in the S/D regions defined by the dummy gate stack, to form S/D trenches 305 as shown in the example resulting structure of FIG. 3F. As also shown, the S/D trenches 305 are etched a depth 351 that extends below a bottom surface 352 of semiconductor body that includes the gate and thus into a sub-fin region. In some embodiments, including the one shown in FIG. 3F, this can extend into the substrate 300. In some embodiments, removing the portions of fins 304 (or the portions of replacement fins 330, where employed) in the S/D regions may include any suitable techniques, such as one or more wet and/or dry etch processes, for example.

Figure 3G:
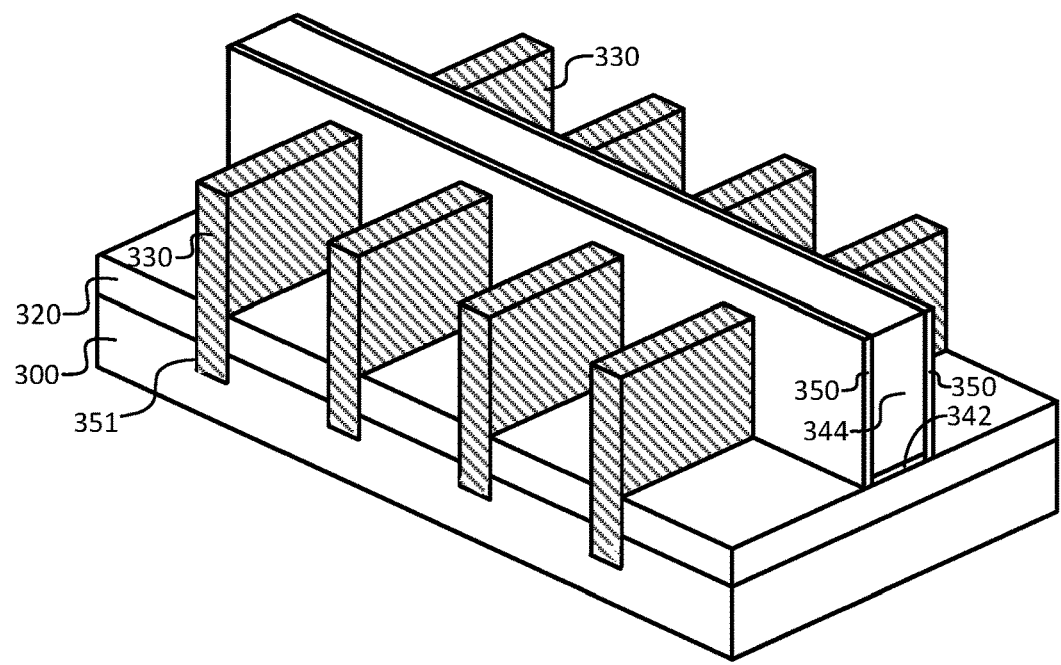

The processing 216 then includes forming source/drain (S/D) regions 330 of the fins, as shown in FIG. 3G. The S/D regions 330 extend a depth 351 into the sub-fin region. Note that the S/D regions 330 are referred to herein as such for ease of description, but each S/D region 330 may be either a source region or a drain region, such that the corresponding S/D region (on the other side of the channel region, and thus, on the other side of the dummy gate stack) is the other of the source region and drain region, thereby forming a source and drain region pair. For instance, as shown in FIG. 3G, there are four different S/D region 330 pairs.

In some embodiments, the S/D regions 330 may include any suitable semiconductor material as will be apparent in light of this disclosure, such as monocrystalline group IV semiconductor material. For instance, a given S/D region may include at least one of In, Ga, As, Si, Ge, Sn, among other elements. In some embodiments, as described herein, the material selected for the S/D regions 330 is selected so as to have a band offset with the material selected for use as the substrate 300. As described above, this band offset reduces leakage in a sub-fin region of the substrate below a bottom surface of a semiconductor body corresponding to a channel region. In one example, InGaAs S/D regions may be disposed on an Ga substrate. These materials have a band offset of from 0.6 eV to 0.8 eV (depending on the In mole fraction), which can complement sub-fin leakage reduction when applied to certain embodiments described herein. In another example, Ge S/D regions can be disposed on a Si substrate. These materials have band offset of 0.4 eV, which can complement sub-fin leakage reduction when applied to certain embodiments described herein. Other combinations of S/D region materials and substrate materials will be appreciated in light of the present disclosure.

In some embodiments, a given S/D region may or may not include n-type and/or p-type dopant. Where present, the dopant may be included in a concentration in the range of 1E17 to 5E22 atoms per cubic centimeter, for example. In some embodiments, a given S/D region may include grading (e.g., increasing and/or decreasing) of the concentration of one or more materials within the feature, such as the grading of a semiconductor material component concentration and/or the grading of the dopant concentration, for example. For instance, in some such embodiments, the dopant concentration included in a given S/D region may be graded such that it is lower near the corresponding channel region and higher near the corresponding S/D contact (alternatively referred to as an electrode), which may be achieved using any suitable processing, such as tuning the amount of dopant in the reactant flow (e.g., during an in-situ doping scheme), to provide an example. In some embodiments, as described above, a dopant introduced to S/D regions can be selected to produce or increase a band offset between the S/D region material and the adjacent substrate. As explained above, a dopant selected in this way can further decrease sub-fin leakage from the S/D regions through an underlying substrate below a channel region of the corresponding fin.

In some embodiments, a given S/D region may include a multilayer structure that includes at least two compositionally different material layers. For instance, in the case of a FFFET device, the source region may include a multilayer structure that includes a p-type doped region and n-type doped region, in accordance with some embodiments. In some embodiments, a given S/D region may be raised such that it extends higher than a corresponding channel region (e.g., in the vertical or Y-axis direction).

Note that the features of the S/D regions 330 are shown with patterning to merely assist with visual identification of the different features in the figures. Also note that the S/D regions 330 are all shown as including the same sizes/shapes in the example structures, for ease of illustration; however, the present disclosure is not intended to be so limited. The patterning and sizing of any of the features in the figures is not intended to limit the present disclosure in any manner. For example, in some embodiments, one of the S/D regions 330 in a corresponding S/D region pair (such as region 330 on one side of the dummy gate stack) may be processed separately than the other S/D region in that pair (such as region 330 on the opposite side of the dummy gate stack), such that a corresponding S/D pair may include different material, dopant type, dopant concentration, sizes, shapes, and/or any other suitable difference as can be understood based on this disclosure. For instance, in the case of a TFET device, one of the S/D regions may include n-type doped semiconductor material and the other of the S/D regions may include p-type doped semiconductor material, to provide an example case, such that the n-type S/D region may be processed separately from the p-type S/D region. The separate processing may be achieved using any suitable techniques, such as masking off S/D regions not to be processed to allow processing of other S/D regions, and then masking off the other S/D regions to allow processing of the originally masked off S/D regions, for example. In some embodiments, a given S/D region may include the same or a similar material composition (e.g., within 1% different) as the corresponding/adjacent channel region (such as both including the same Ge-rich material). However, in other embodiments, a given S/D region may include a different material composition (e.g., at least 1, 2, 3, 4, 5, or 10% different) relative to the corresponding/adjacent channel region, for example.

Figure 3H:
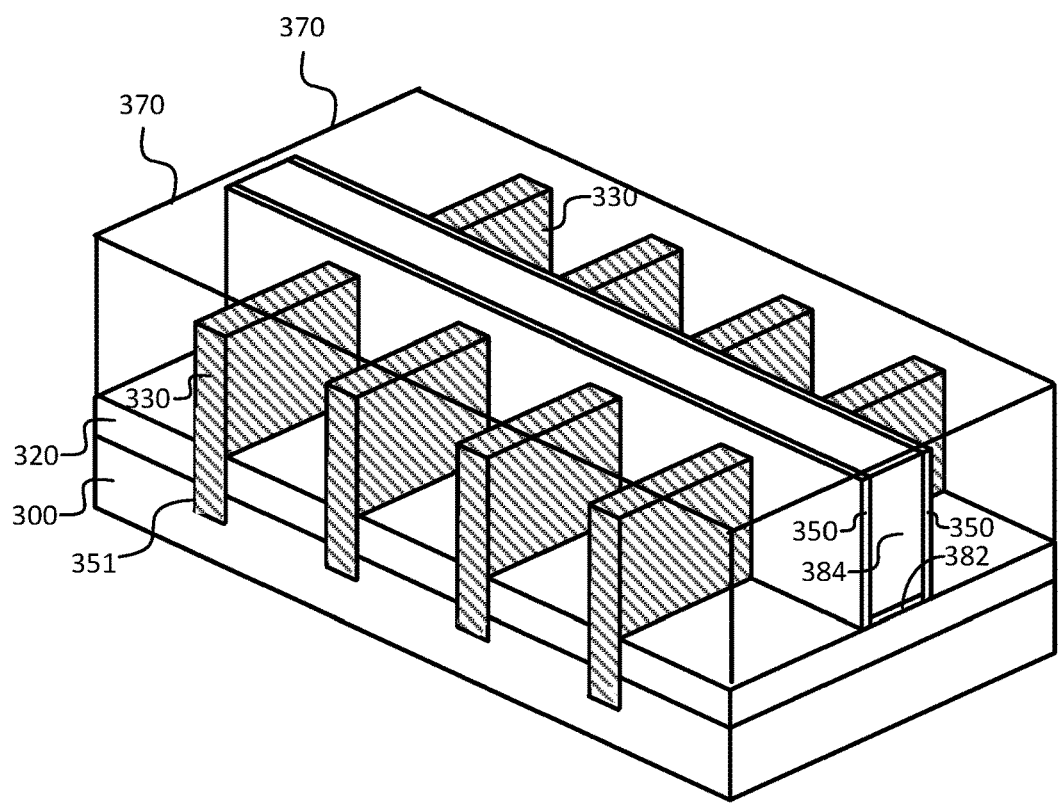

Method 200 of FIG. 2 continues with performing 220 the final gate stack processing to form the example resulting structure of FIG. 3H, in accordance with some embodiments. As shown, the processing in this example embodiment included depositing interlayer dielectric (ILD) layer 370 on the structure of FIG. 3G, followed by planarization and/or polishing (e.g., CMP) to reveal the dummy gate stack. Note that ILD layer 370 is shown as transparent in the example structure of FIG. 3H to allow for the underlying features to be seen; however, the present disclosure is not intended to be so limited. Also note that ILD layer 370 may include a multilayer structure, even though it is illustrated as a single layer. Further note that in some cases, ILD layer 370 and STI material 320 may not include a distinct interface as shown in FIG. 3H, particularly where, e.g., the ILD layer 370 and STI material 320 include the same dielectric material (e.g., where both include silicon dioxide). In some embodiments, the ILD layer 370 may include any desired electrical insulator, dielectric, oxide (e.g., silicon oxide), and/or nitride (e.g., silicon nitride) material, as will be apparent in light of this disclosure.

The final gate stack processing 220, in this example embodiment, continued with removing the dummy gate stack (including dummy gate 344 and dummy gate dielectric 342) to allow for the final gate stack to be formed. Recall that in some embodiments, the formation of the final gate stack, which includes gate dielectric 382 and gate electrode 384, may be performed using a gate first flow. In such embodiments, the final gate stack processing may have been alternatively performed as indicated by optional gate first flow 200' in the method 200, instead of forming a dummy gate stack. However, in this example embodiment, the final gate stack is formed using a gate last flow (also called a replacement gate or replacement metal gate (RMG) process). Regardless of whether gate first or gate last processing is employed, the final gate stack can include gate dielectric 382 and gate electrode 384 as shown in FIG. 3H and described herein. It will be appreciated that the gate dielectric 382 may include one or more layers. For example, the gate dielectric 382 can include at least one of a native oxide forming on the channel region of the fin and at least one additional dielectric layer.

Note that when the dummy gate is removed, the channel region of fins 304 (or replacement material fins 330), which is the portion of the fins that were covered by the dummy gate stack, are exposed to allow for any desired processing of those channel regions. Such processing of a given channel region may include various different techniques, such as removing and replacing the channel region with replacement material, doping the channel region as desired, forming the channel region into one or more nanowires (or nanoribbons) for a gate-all-around (GAA) transistor configuration, forming the channel region into a beaded-fin configuration, cleaning/polishing the channel region, and/or any other suitable processing as will be apparent in light of this disclosure.

Figure 4:
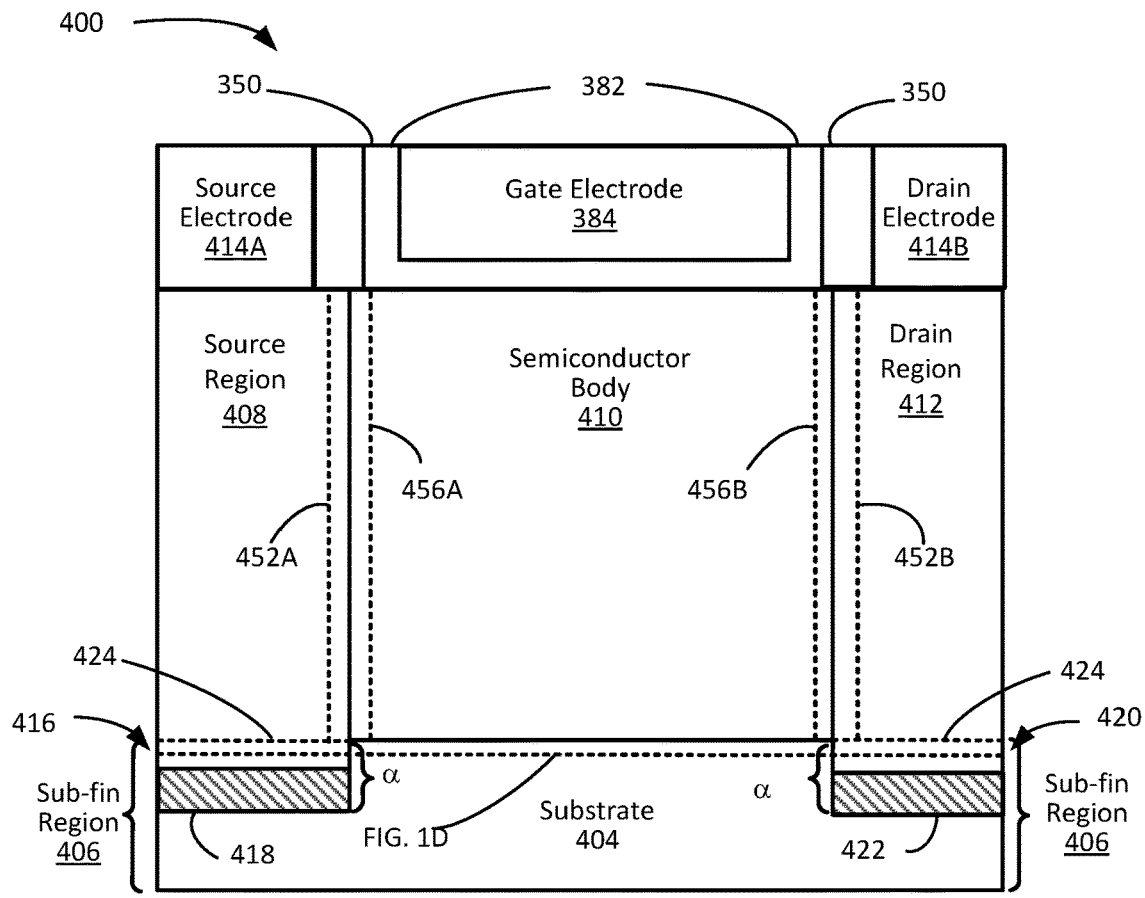
FIG. 4 is a cross-sectional view of an example FinFET semiconductor device prepared according to the example method depicted in FIG. 2, the cross-section taken perpendicular to a gate, in accordance with an embodiment of the present disclosure.

Method 200 of FIG. 2 continues with performing 222 S/D electrode processing. The S/D electrodes are shown in FIG. 4, which is a cross-section taken perpendicular to the gate and through the resulting S/D electrodes 414A, 414B, in accordance with some embodiments.

S/D electrode processing 222, in this example embodiment, first includes forming S/D electrode trenches above the S/D regions 330. In some such embodiments, the contact trenches may be formed using any suitable techniques, such as performing one or more wet and/or dry etch processes to remove portions of ILD layer 370 as shown, and/or any other suitable processing as will be apparent in light of this disclosure. Such etch processing may be referred to as the S/D electrode trench etch processing, or simply, electrode (or equivalently "contact") trench etch processing. Further, in some such embodiments, the ILD may first be patterned such that areas that are not to be removed via the contact trench etch processing are masked off, for example. In some embodiments, one or more etch stop layers may have been formed on S/D regions 330 prior to performing the contact trench etch processing, to help with the controllability of the processing (e.g., to help stop the etching to help prevent the etching from consuming material of the S/D regions 330 in an undesired manner). In some such embodiments, the etch stop layer(s) may include insulator material that is dissimilar from the ILD 370 material (e.g., to provide relative etch selectivity) and/or material that that is resilient to the contact trench etch, such as a carbon-based etch stop layer (e.g., with carbon concentration in the range of 1-80%).

S/D electrodes processing 222 includes forming S/D electrodes (again, shown in FIG. 4 as electrodes 414A and 414B) above respective S/D regions (408, 412, respectively in FIG. 4), in accordance with some embodiments. It will be appreciated that S/D contacts are electrically connected to S/D regions 330, and in some cases, they may also be in physical contact with those S/D regions 330. In some embodiments, S/D electrodes may be formed using any suitable techniques, such as depositing metal or metal alloy (or other suitable electrically conductive material) in the contact trenches. In some embodiments, S/D electrodes formation may include silicidation, germanidation, and/or annealing processes, for example, where such processing may be performed to form an intervening electrodes layer before forming the bulk electrode metal structure, for instance. In some embodiments, S/D electrodes may include aluminum or tungsten, although any suitable conductive metal or alloy can be used, such as silver, nickel-platinum, or nickel-aluminum, for example. Generally, in some embodiments, one or more of the S/D electrodes may include a resistance reducing metal and an electrode plug metal, or just an electrode plug, for instance. Example electrode resistance reducing metals include, for instance, nickel, aluminum, titanium, gold, gold-germanium, nickel-platinum, or nickel aluminum, and/or other such resistance reducing metals or alloys. Example electrode plug metals include, for instance, aluminum, copper, nickel, platinum, titanium, or tungsten, or alloys thereof, although any suitably conductive contact metal or alloy may be used. In some embodiments, S/D electrodes may employ low work-function metal material(s) and/or high work-function metal material(s), depending on the particular configuration. In some embodiments, additional layers may be present in the S/D electrode regions, such as adhesion layers (e.g., titanium nitride) and/or liner or barrier layers (e.g., tantalum nitride), if so desired.

Method 200 of FIG. 2 continues with completing 224 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes 202-224 of method 200 are shown in a particular order for ease of description. However, one or more of the processes 202-224 may be performed in a different order or may not be performed at all. For example, box 214 is an optional process that need not be performed in embodiments employing a gate first process flow, for example. Recall that the techniques may be used to form a multitude of different transistor types and configurations. Although the techniques are primarily depicted and described herein in the context of employing one or more dopant diffusion barrier elements for both of the S/D regions of a given transistor, the present disclosure is not intended to be so limited, as the techniques may be used to benefit only one S/D region of a given transistor (and thus, only one side of a given channel region), and not the other, in some embodiments. Numerous variations and configurations will be apparent in light of the present disclosure.

Sub-Fin Region

Embodiments described herein include, as indicated above, trenches can be formed so that regions of the source and drain regions extend into a "sub-fin" region. This configuration places portions of the fin that may have features enabling higher levels of off-state leakage or that may have poor electrical characteristics (due to low dopant concentrations) below an active portion of the fin, and in some cases within an underlying substrate.

FIG. 4 illustrates an architecture of an example semiconductor device 400, in accordance with an embodiment of the present disclosure. The example semiconductor device 400 includes a substrate 404, a source region 408, a semiconductor body that includes 410 a channel region, a drain region 412, a source sub-fin region 416 and a drain sub-fin region 420. The example semiconductor device 400 also includes a gate electrode 384, a source electrode 414A, a drain electrode 414B, a gate dielectric layer 382, and spacers 350, all of which have been described above and need no further explanation.

Using techniques described above, trenches in fin regions corresponding to the replacement source region 408 and replacement drain region 412 are formed so as to extend below a bottom surface of the semiconductor body 410 (indicated by lines 424). As shown, these sub-fin regions are identified in FIG. 4 as a source sub-fin region 416 and a drain sub-fin region 420. These sub-fin regions 416, 420 are formed by performing an etch after removing precursor structures (e.g., native fins 302) so as to extend the trenches, and ultimately the source and drain regions 408, 412, into the sub-fin region 406 of the substrate 404. Note that the depth of the sub-fin regions 416, 420 extends a depth a below the bottom surface of the semiconductor body 410 (i.e., below the level indicated by the lines 424). In some such example embodiments, the depth a can be within any of the following ranges: at least 2 nanometers below the bottom surface of the semiconductor body, or from 5 nm to 25 nm below the bottom surface of the semiconductor body; from 5 nm to 15 nm below the bottom surface of the semiconductor body; from 5 nm to 10 nm below the bottom surface of the semiconductor body; from 10 nm to 25 nm below the bottom surface of the semiconductor body; from 10 nm to 15 nm below the bottom surface of the semiconductor body; from 15 nm to 25 nm below the bottom surface of the semiconductor body. In a more general sense, the depth a may be within any range between 2 nm to 50 nm (or higher) below the bottom surface of the semiconductor body. As will be appreciated in light of this disclosure, providing a depth a past a certain point ultimately provides a diminishing return, depending on factors such as the processing node, device dimensions, and desired performance, as balanced against factors such as time to etch the trenches and deposit source/drain structure therein. In short, the present disclosure is not intended to be limited to any particular trench configurations or depth ranges, but rather encompasses all trench configurations and depth ranges that provide advantages as variously described herein.

The source and drain sub-fin regions 416, 420 are thus configured to contain portions of the source and drain regions 408, 412 that are crystallographically defective or have doping concentrations too low for an active portion of a source/drain region. These defective and/or low doping concentration portions are indicated as shaded regions 418 and 422 of the source region 408 and drain region 412, respectively. Thus disposed below an active portion of the fin (e.g., below the lines 424), these defective portions do not detract from the performance of a corresponding integrated circuit device.

In some embodiments, the source and drain sub-fin regions 416, 420 may include a buffer layer disposed between the substrate 404 and the source region 408 and drain region 412 respectively. For example, for source and drain regions 408, 412 in which the majority charge carrier is an electron, a GaAs, GaInP, or Si buffer layer can be formed in the source and drain sub-fin regions 416, 420 prior to forming InGaAs source and drain regions 408, 412. In another embodiment, an InGaAs or InP buffer can be formed in the source and drain sub-fin regions 416, 420 prior to forming InAs source and drain regions 408, 412. For these preceding examples, the Indium content is between any of the following ranges: 53% to 70%; 53% to 60%; 60% to 70%. In examples in which $In_xGa_{1-x}As$ source and drain regions 408, 412 is disposed on an $In_yGa_{1-y}As$ buffer layer, where x>y, a conduction band offset reduces off-state leakage. Similarly, SiGe or Ge source and drain regions 408, 412 can be formed on a Si or SiGe buffer layer.

Figure 5:
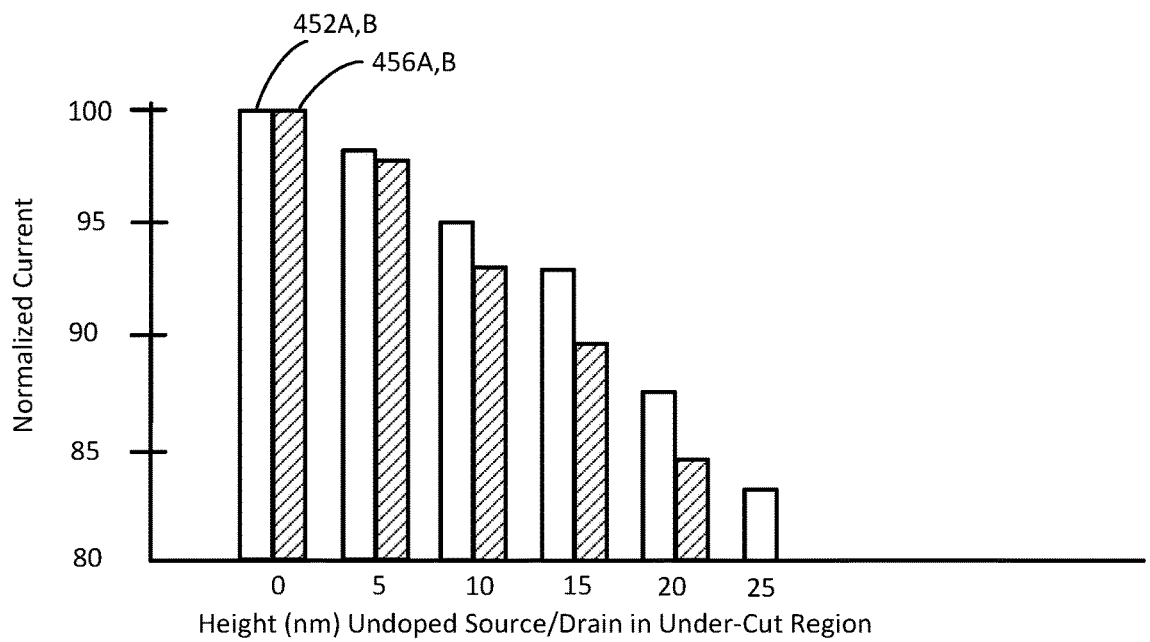
FIG. 5 illustrates simulated currents in two pluralities FinFETs fabricated according to some embodiments described herein.

FIG. 5 illustrates simulated currents in a FinFET fabricated according to some embodiments described herein. In the simulated embodiments, an undoped nucleation (or "seed") layer of Ge was placed in a sub-fin region (analogous to source and drain sub-fin regions 416, 420) on a Si substrate. The x-axis of FIG. 5 shows a height of the undoped nucleation layer disposed between the underlying substrate (analogous to the substrate 404) and a doped portion of a Ge fin (analogous to source and drain regions 408 and 412). The y-axis of FIG. 5 is current in an on-state of an integrated circuit device normalized relative to Ge source/drain regions that do not include an undoped Ge seed layer but rather are doped throughout an entire fin height. The simulation results of FIG. 5 assume a 50 nm fin height.

For each undoped nucleation layer thickness, two different widths of the doped source/drain regions are characterized. The open bar in FIG. 5 corresponds to a width of a doped portion of the source/drain regions that do not overlap with a gate dielectric layer, as illustrated by lines 452A, 452B in FIG. 4. The shaded bar in FIG. 5 corresponds to a width of a doped portion of the source/drain regions that does overlap with a gate dielectric layer, as illustrated by lines 456A, 456B in FIG. 4.

As shown, even a 5 nm undoped Ge nucleation layer can produce well over 95% of the on-state current produced by a fully doped Ge fin of the same height. This high current delivery of the fin including the undoped layer can be attributed, at least in part, to disposing the undoped nucleation layer in a sub-fin region that is not in an active portion of the fin, as described above.

As also shown in FIG. 5, while on-state current decreases as the thickness of the undoped see layer increases, the normalized current is still greater than 85% even for undoped portions that are as much as half of the doped fin height.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect source and drain regions disposed within the sub-fin region (i.e., extending in source and drain regions below a bottom surface of the semiconductor body). More specifically, these techniques can be used to detect materials with different lattice constants in the sub-fin region.

Example System

Figure 6:
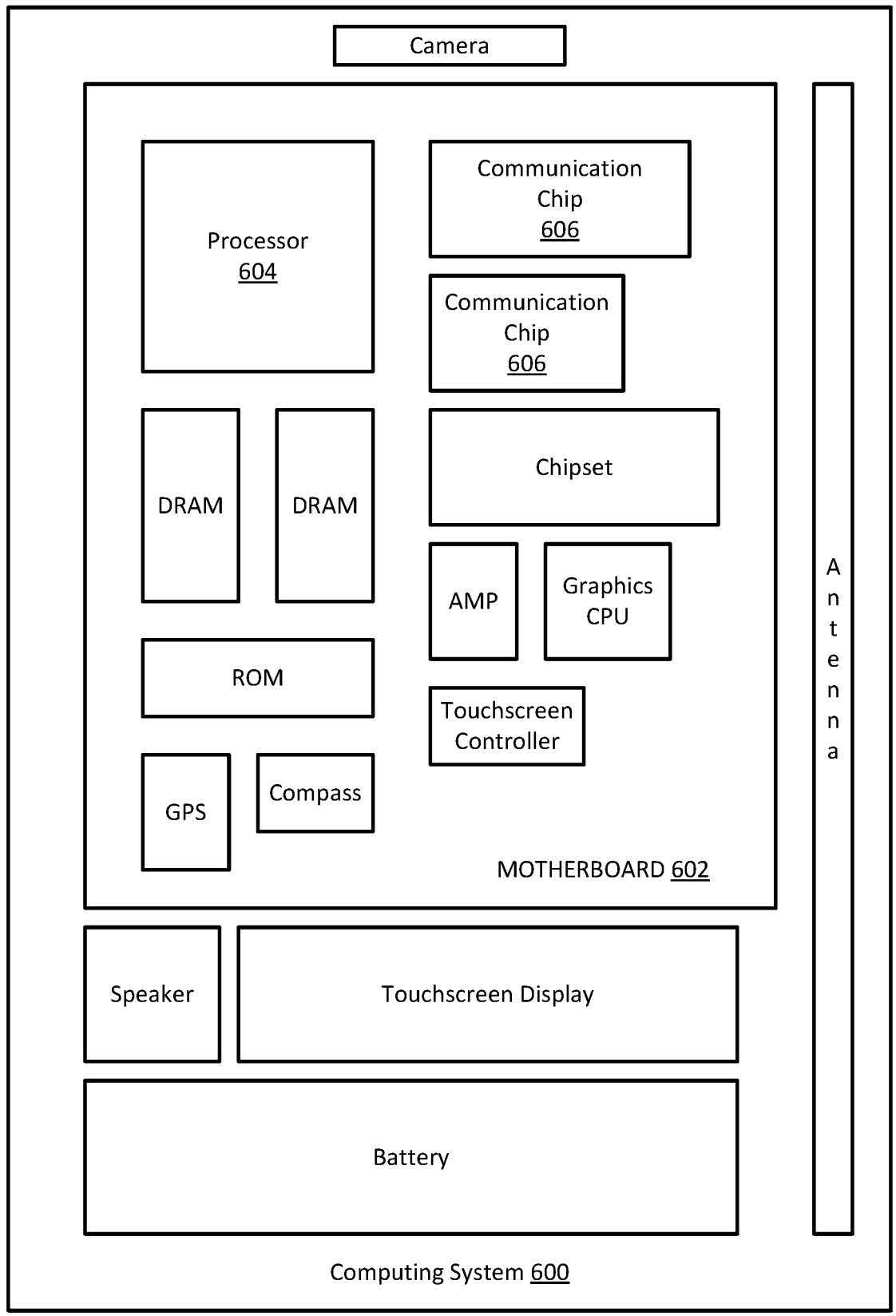
FIG. 6 illustrates a computing system implemented with integrated circuit structures and/or transistor devices formed using the techniques disclosed herein, in accordance with some embodiments of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board, whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., to include one or more integrated circuit devices fabricated to include source and drain sub-fin regions that improves off-state leakage in a heterojunction transistor, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others. In some embodiments, communication chip 606 may include one or more transistor structures having a gate stack an access region polarization layer as variously described herein.

The processor 604 of the computing system 600 includes an integrated circuit die packaged within the processor 604. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device comprising a semiconductor substrate comprising a first material having a first band energy; a semiconductor body on and extending from the semiconductor substrate, the semiconductor body having a top surface and a bottom surface proximate the substrate and opposite the top surface; a gate structure on the top surface and opposing sidewalls of the semiconductor body, thereby defining a non-planar channel region in the semiconductor body, the gate structure including a gate dielectric structure on the top and the opposing sidewalls of the semiconductor body, and a gate electrode structure on the gate dielectric structure; and a source region and a drain region, with the semiconductor body between the source region and the drain region, wherein the source and drain regions extend into the substrate to a depth below the bottom surface of the semiconductor body, the source region and the drain region comprising a second material having a second band energy that has a band energy offset with the first band energy of the first material.

Example 2 includes the subject matter of Example 1, wherein the band energy offset between the first material and the second material is at least 0.4 eV.

Example 3 includes the subject matter of Example 1 or 2, wherein the band energy offset between the first material and the second material is at least 0.7 eV.

Example 4 includes the subject matter of any of the preceding Examples, wherein the first material has a first type of majority charge carrier and the second material has a second type of majority charge carrier having a charge opposite to the first type.

Example 5 includes the subject matter of any of the preceding Examples, wherein the first material is silicon and the second material comprises germanium.

Example 6 includes the subject matter of any of Examples 1 through 4, wherein the first material comprises a first group IV semiconductor material; and the second material comprises a second group IV semiconductor material compositionally different from the first group IV semiconductor material.

Example 7 includes the subject matter of any of Examples 1 through 4, wherein the first material comprises indium and gallium; and the second material comprises indium, gallium, and arsenic.

Example 8 includes the subject matter of Examples 1 through 4, wherein the first material comprises a first group III-V semiconductor material; and the second material comprises a second group III-V semiconductor material compositionally different from the first group III-V semiconductor material.

Example 9 includes the subject matter of any of the preceding Examples, wherein portions of the source region and the drain region extending into the substrate have a lattice mismatch with the substrate that is greater than 4%.

Example 10 includes the subject matter of any of the preceding Examples, wherein portions of the source region and the drain region extending into the substrate have a lower doping concentration than a doping concentration of the source region and a doping concentration of the drain region above the substrate.

Example 11 includes the subject matter of any of the preceding Examples, wherein a portion of the source region and a portion of the drain region disposed within the substrate are undoped.

Example 12 includes the subject matter of any of the preceding Examples, wherein the source region and the drain region extending into the substrate have a higher dislocation density than the source region and drain region disposed above the substrate.

Example 13 includes the subject matter of any of the preceding Examples, wherein the depth of at least one of the source region and the drain region extending into the substrate is from 5 nanometers to 15 nanometers below the bottom surface of the semiconductor body. In a more general sense, the source and drain regions may extend into the substrate to a depth that is at least 2 nanometers below the bottom surface of the semiconductor body, according to certain other embodiments.

Example 14 includes the subject matter of any of the preceding Examples, wherein the depth of at least one of the source region and the drain region extending into the substrate is from 10 nanometers to 15 nanometers below the bottom surface of the semiconductor body, or from 10 nanometers to 20 nanometers below the bottom surface of the semiconductor body, or from 10 nanometers to 25 nanometers below the bottom surface of the semiconductor body. Numerous other trench depths will be apparent in light of this disclosure, such as from 7 or 8 nanometers to 14-21 nanometers below the bottom surface of the semiconductor body, or from 4 nanometers to 15 nanometers below the bottom surface of the semiconductor body, or from 6 nanometers to 18 nanometers below the bottom surface of the semiconductor body, or from 15 nanometers to 30 nanometers below the bottom surface of the semiconductor body, or from 25 nanometers to 50 nanometers below the bottom surface of the semiconductor body, to name a few other specific examples.

Example 15 includes the subject matter of any of the preceding Examples, wherein a distance between the source region and the drain region is less than 20 nanometers.

Example 16 includes the subject matter of any of the preceding Examples, wherein a distance between the source region and the drain region is less than 10 nanometers. In a more general sense, this distance between the source and drain regions may vary from one embodiment to the next, depending on factors such as process node and device geometry. To this end, in still other embodiments, the distance between the source region and the drain region may be less than 9 nanometers, or less than 8 nanometers, or less than 7 nanometers, or less than 6 nanometers, or less than 5 nanometers, or less than 4 nanometers, to name a few other examples.

Example 17 includes the subject matter of any of the preceding Examples, further comprising a buffer layer between a substrate and at least one of the source region and the drain region.

Example 18 includes the subject matter of Example 17, further comprising a first buffer layer between the substrate and the source region; and a second buffer layer between the substrate and the drain region.

Example 19 includes the subject matter of Example 18, wherein at least one of the first buffer layer and the second buffer layer comprises gallium and arsenic.

Example 20 includes the subject matter of Example 18, wherein at least one of the first buffer layer and the second buffer layer comprises silicon.

Example 21 includes the subject matter of Example 18, wherein at least one of the first buffer layer and the second buffer layer comprises silicon and germanium.

Example 22 includes the subject matter of Example 18, wherein at least one of the first buffer layer and the second buffer layer comprises gallium, indium, and phosphorous.

Example 23 includes the subject matter of any of the preceding Examples, wherein the semiconductor body comprises the second material having the second band energy and having the band energy offset with the first band energy of the first material.

Example 24 includes the subject matter of any of Examples 1 to 22, wherein the semiconductor body comprises a third material having a third band energy that has a band energy offset with at least one of the first band energy of the first material and the second band energy of the second material.

Example 25 includes the subject matter of Example 24, wherein the band energy offset between the first material and the third material is at least 0.4 eV.

Example 26 includes the subject matter of Example 24, wherein the band energy offset between the first material and the third material is at least 0.7 eV.

Example 27 includes the subject matter of Example 24, wherein the first material has a first type of majority charge carrier and the third material has a second type of majority charge carrier having a charge opposite to the first type.

Example 28 includes the subject matter of Example 24, wherein the first material is silicon and the third material comprises germanium.

Example 29 includes the subject matter of Example 24, wherein the first material comprises a first group IV semiconductor material; and the third material comprises a group IV semiconductor material compositionally different from the first group IV semiconductor material.

Example 30 includes the subject matter of Example 24, wherein the first material is a group IV semiconductor material; and the third material is a group III-V semiconductor material.

Example 31 includes the subject matter of Example 24, the first material comprises indium and gallium; and the third material comprises indium, gallium, and arsenic.

Example 32 includes the subject matter of Example 24, the first material comprises a first group III-V semiconductor material; and the third material comprises a second group III-V semiconductor material compositionally different from the first group III-V semiconductor material.

Example 33 is a computing device comprising the subject matter of any of the preceding Examples.

Example 34 is a method for forming an integrated circuit device comprising forming a semiconductor body on a substrate, the semiconductor body comprising a bottom surface proximate to a surface of the substrate; forming a gate structure on the top surface and opposing sidewalls of the semiconductor body, thereby defining a non-planar channel region in the semiconductor body, the gate structure including a gate dielectric structure on the top and the opposing sidewalls of the semiconductor body, and a gate electrode structure on the gate dielectric structure; forming a source region and a drain region on the substrate adjacent to the semiconductor body, the source region and the drain region on opposite sides of the semiconductor body and extending into a sub-fin region of the substrate below a bottom surface of the semiconductor body, wherein the source region and the drain region have a band energy offset with the substrate; and forming a first contact above the source region and a second contact above the drain region.

Example 35 includes the subject matter of Example 34, further comprising forming a first buffer layer in the sub-fin region between the substrate and the source region; and forming a second buffer layer in the sub-fin region between the substrate and the drain region.

Example 36 includes the subject matter of Examples 34 and 35, wherein portions of the source region and the drain region disposed in corresponding sub-fin regions are undoped and portions of the source region and the drain region disposed above the corresponding sub-fin regions are doped.

Example 37 includes the subject matter of Examples 34 through 36, wherein portions of the source region and the drain region disposed in corresponding sub-fin regions have a first defect concentration and portions of the source region and the drain region disposed above the corresponding sub-fin regions have a second defect concentration less than the first defect concentration.

Example 38 includes the subject matter of Examples 34 through 37, wherein the substrate is formed from a first material and the source region and the drain region are formed from a second material, the first material and the second material comprising a band energy offset in the sub-fin region.

Example 39 includes the subject matter of Example 38, wherein the semiconductor body is formed from the second material that comprises the band energy offset with the first material.

Example 40 includes the subject matter of Examples 38 and 39, wherein the semiconductor body is formed from the second material that comprises the band energy offset with the first material.

What is claimed is:

1. An integrated circuit comprising:
   a semiconductor base comprising a first material having a first band energy;
   a semiconductor body on the semiconductor base, the semiconductor body having a top surface and a bottom surface proximate the semiconductor base and opposite the top surface;
   a gate structure on the top surface and opposing sidewalls of the semiconductor body, the gate structure including a gate electrode and a gate dielectric between the gate electrode and the semiconductor body; and
   a source region and a drain region, the semiconductor body between the source region and the drain region, wherein the source and drain regions have a bottom surface that is lower than the bottom surface of the semiconductor body, the source region and the drain region comprising a second material having a second band energy that has a band energy offset with the first band energy of the first material.

2. The integrated circuit of claim 1, wherein the band energy offset between the first material and the second material is at least 0.7 eV.

3. The integrated circuit of claim 1, wherein the first material has a first type of majority charge carrier with a first polarity and the second material has a second type of majority charge carrier having a second polarity opposite of the first polarity.

4. The integrated circuit of claim 1, wherein:
   the first material comprises a first group IV semiconductor material; and
   the second material comprises a second group IV semiconductor material compositionally different from the first group IV semiconductor material.

5. The integrated circuit of claim 1, wherein:
   the first material comprises a first group III-V semiconductor material; and
   the second material comprises a second group III-V semiconductor material compositionally different from the first group III-V semiconductor material.

6. The integrated circuit of claim 1, wherein portions of the source region and the drain region have a lattice mismatch with the semiconductor base that is greater than 4%.

7. The integrated circuit of claim 1, wherein a portion of the source region and a portion of the drain region lower than the bottom surface of the semiconductor body are undoped semiconductor material.

8. The integrated circuit of claim 1, wherein the bottom surface of at least one of the source region and the drain region is from 5 nanometers to 15 nanometers lower than the bottom surface of the semiconductor body.

9. The integrated circuit of claim 1, wherein a distance between the source region and the drain region is less than 20 nanometers.

10. The integrated circuit of claim 1, further comprising a buffer layer between the semiconductor base and at least one of the source region and the drain region.

11. The integrated circuit of claim 10, wherein the buffer layer comprises gallium and arsenic.

12. The integrated circuit claim 1, further comprising:
    a first buffer layer between the substrate and the source region; and
    a second buffer layer between the substrate and the drain region;
    wherein at least one of the first buffer layer and the second buffer layer comprises silicon and germanium.

13. The integrated circuit of claim 1, further comprising:
    a first buffer layer between the substrate and the source region; and
    a second buffer layer between the substrate and the drain region;
    wherein at least one of the first buffer layer and the second buffer layer comprises gallium, indium, and phosphorous.

14. The integrated circuit of claim 1, wherein the semiconductor body comprises the second material having the second band energy and having the band energy offset with the first band energy of the first material.

15. The integrated circuit of claim 1, wherein the semiconductor body comprises a third material having a third band energy that has a band energy offset with at least one of the first band energy of the first material and the second band energy of the second material.

16. The integrated circuit of claim 15, wherein a band energy offset between the first material and the third material is at least 0.4 eV.

17. The integrated circuit of claim 15, wherein the first material is silicon and the third material comprises germanium.

18. The integrated circuit device of claim 15, wherein:
the first material comprises a first group IV semiconductor material; and
the third material comprises a second group IV semiconductor material compositionally different from the first group IV semiconductor material.

19. A computing device comprising the integrated circuit of claim 1.

20. The integrated circuit of claim 1, wherein the first material comprises a group IV semiconductor material and the semiconductor body comprises a group III-V semiconductor material.

* * * * *